(12) United States Patent
Kalman et al.

(10) Patent No.: US 11,906,779 B2
(45) Date of Patent: *Feb. 20, 2024

(54) EMBEDDING LEDS WITH WAVEGUIDES

(71) Applicant: AVICENATECH CORP., Sunnyvale, CA (US)

(72) Inventors: Robert Kalman, Sunnyvale, CA (US); Bardia Pezeshki, Sunnyvale, CA (US); Alexander Tselikov, Sunnyvale, CA (US); Cameron Danesh, Sunnyvale, CA (US)

(73) Assignee: AvicenaTech Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/119,111

(22) Filed: Mar. 8, 2023

(65) Prior Publication Data
US 2023/0296835 A1 Sep. 21, 2023

Related U.S. Application Data

(63) Continuation of application No. 17/323,625, filed on May 18, 2021, now Pat. No. 11,619,781.

(60) Provisional application No. 63/026,638, filed on May 18, 2020.

(51) Int. Cl.
G02B 6/122 (2006.01)
G02B 6/42 (2006.01)
H01L 33/60 (2010.01)
G02B 6/12 (2006.01)

(52) U.S. Cl.
CPC ............ *G02B 6/122* (2013.01); *G02B 6/4214* (2013.01); *H01L 33/60* (2013.01); *G02B 2006/12102* (2013.01); *G02B 2006/12123* (2013.01)

(58) Field of Classification Search
CPC .................. G02B 6/122; G02B 6/4214; G02B 2006/12102; G02B 2006/12123; G02B 6/4298; G02B 6/43; H01L 33/60; H01L 33/58

See application file for complete search history.

(56) References Cited

U.S. PATENT DOCUMENTS

| | | |
|---|---|---|
| 2002/0018628 A1 | 2/2002 | Kim |
| 2013/0111744 A1 | 5/2013 | Tischler |
| 2013/0230280 A1 | 9/2013 | Kadar-Kallen |
| 2016/0170120 A1 * | 6/2016 | Shani ................ G02F 1/133614 362/607 |
| 2018/0239096 A1 | 8/2018 | Houbertz |

OTHER PUBLICATIONS

International Search Report on related PCT Application No. PCT/US2021/032979 from International Searching Authority (KIPO) dated Sep. 7, 2021.
Written Opinion on related PCT Application No. PCT/US2021/032979 from International Searching Authority (KIPO) dated Sep. 7, 2021.

* cited by examiner

*Primary Examiner* — John Bedtelyon
(74) *Attorney, Agent, or Firm* — KOS IP Law LLP

(57) ABSTRACT

A microLED may be used to generate light for intra-chip or inter-chip communications. The microLED, or an active layer of the microLED, may be embedded in a waveguide. The waveguide may include a lens.

14 Claims, 9 Drawing Sheets

EMBEDDING LEDS WITH WAVEGUIDES

CROSS-REFERENCE TO RELATED APPLICATION

This application is a continuation of U.S. patent application Ser. No. 17/323,625, filed on May 18, 2021, which claims the benefit of the filing date of U.S. Provisional Patent Application No. 63/026,638 filed on May 18, 2020, the disclosures of each of which are incorporated by reference herein.

FIELD OF THE INVENTION

The present invention relates generally to optical communications using microLEDs, and more particularly to optical communication systems with microLEDs embedded in waveguide material.

BACKGROUND OF THE INVENTION

Desires for high-performance computing and networking is ubiquitous and seemingly ever-present. Prominent applications include data center servers, high-performance computing clusters, artificial neural networks, and network switches.

For decades, dramatic integrated circuit (IC) performance and cost improvements were driven by shrinking transistor dimensions combined with increasing die sizes, summarized in the famous Moore's Law. Transistor counts in the billions have allowed consolidation onto a single system-on-a-chip (SoC) of functionality that was previously fragmented across multiple ICs.

However, the benefits of further transistor shrinks are decreasing dramatically as decreasing marginal performance benefits combine with decreased yields and increased per-transistor costs. Independent of these limitations, a single IC can only contain so much functionality, and that functionality is constrained because the IC's process cannot be simultaneously optimized for different functionality, e.g., logic, DRAM, and I/O.

In fact, there are significant benefits to "de-integrating" SoCs into smaller "chiplets", including: the process for each chiplet can be optimized to its function, e.g., logic, DRAM, high-speed I/O; chiplets are well-suited to reuse in multiple designs; chiplets are less expensive to design; and chiplets have higher yield because they are smaller with fewer devices.

There is, however, a major drawback to chiplets compared to SoCs: use of chiplets generally requires far more chip-to-chip connections. Compared to the on-chip connections between functional blocks in SoCs, chip-to-chip connections are typically much less dense and require far more power (for example normalized as energy per bit).

BRIEF SUMMARY OF THE INVENTION

Some embodiments provide optical interconnects (for example connecting between chips and/or chiplets based on microLED sources. A microLED may be generally defined as a LED with a diameter of <100 um in some embodiments, <20 um in some embodiments, <4 um in some embodiments, and <1 um in some embodiments, and can be made with diameters <1 um. In some embodiments the microLED sources can support optical links with lengths of >1 m at >1 Gbps with lower drive power and very high density.

In some embodiments the microLEDs are coupled with high efficiency to optical communication channels. In some embodiments the optical communication channel comprises, or consists of in some embodiments, waveguides, free-space, or some combination of the two. Discussed herein are embodiments for coupling microLEDs to optical communication channels.

Some aspects of the invention provide an optical coupling arrangement for an optical communication system, comprising: a microLED on a substrate, the microLED having an active layer; a waveguide on the substrate, the microLED being at least partially within the waveguide; a reflector on at least a portion of the waveguide, the reflector positioned to reflect light from the microLED down an axis of the waveguide; and a lens within the waveguide, in an optical path of the light from the microLED. In some aspects the active layer of the microLED is within the waveguide.

In some aspects the lens is in an optical path between the microLED and the reflector. In some aspects the lens is a convex lens. In some such aspects the lens is of a material with a higher index of refraction than material of the waveguide. In some aspects the lens is a concave lens. Ins some such aspects the lens is of a material with a lower index of refraction than material of the waveguide. In some aspects the reflector forms a 45 degree turning mirror.

In some aspects the reflector is in an optical path between the microLED and the lens. In some aspects the lens is a convex lens. In some such aspects the lens is of a material with a higher index of refraction than material of the waveguide. In some aspects the lens is a concave lens. In some such aspects the lens is of a material with a lower index of refraction than material of the waveguide.

In some aspects the reflector has a curved shape. In some such aspects the reflector has a parabolic shape.

In some aspects the reflector is at an end of the waveguide.

In some aspects the microLED includes a curved surface.

In some aspects the active layer of the microLED does not extend to side edges of the microLED. In some such aspects the microLED includes a curved surface.

Some aspects further provide an electrical connection from a top of the waveguide, through a via in the waveguide, to a contact on top of the LED.

These and other aspects of the invention are more fully comprehended upon review of this disclosure.

DETAILED DESCRIPTION

A microLED is made from a p-n junction of a direct-bandgap semiconductor material. A microLED is distinguished from a semiconductor laser (SL) in the following ways: (1) a microLED does not have an optical resonator structure; (2) the optical output from a microLED is almost completely spontaneous emission whereas the output from a SL is dominantly stimulated emission; (3) the optical output from a microLED is temporally and spatially incoherent whereas the output from a SL has significant temporal and spatial coherence; (4) a microLED is usually designed to be operated down to a zero minimum current, whereas a SL is designed to be operated above a minimum threshold current, which is typically at least 1 mA.

A microLED may be distinguished from a standard LED by having an emitting region of less than 100 μm×100 μm. MicroLEDs have small etendue, allowing them to be efficiently coupled into small waveguides and/or imaged onto small photodetectors. For convenience, the following discussion may generally mention LEDs. It should be recognized, however, that the discussion pertains to microLEDs, which may be considered a particular type of LED.

Figure 1:
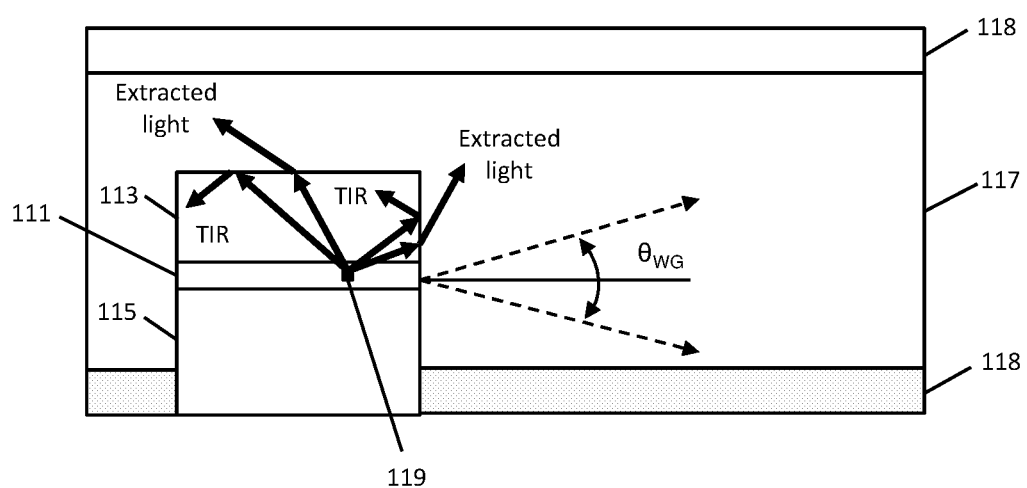
FIG. 1 shows a sectional view of a simplified structure of a microLED embedded in a waveguide.

FIG. 1 shows a sectional view of a simplified structure of a microLED embedded in a waveguide. Light is emitted from the microLED in a thin active layer 111 via radiative carrier recombination. In some embodiments, this radiative recombination occurs dominantly in one or more quantum wells (QWs) (not shown in FIG. 1). The active layer is bounded above and below by p and n layers 113, 115. The active layer is shown in FIG. 1 as being within a waveguide core 117. The waveguide core is bounded by waveguide cladding 118.

The active layer can be thought of as comprising a large number of infinitesimal emitters, with FIG. 1 showing an example infinitesimal emitting element 119. Each emitter is much smaller than the optical wavelength and emits light over a large angular range. The emission pattern from each of the LED surfaces (i.e., top and bottom) is approximately Lambertian, where light is emitted into a half-sphere of $2\pi$ steradians.

LEDs may also emit significant light from the edge of the LED adjacent to the active layer (as opposed to from the top and bottom surfaces), especially if the LED is small, e.g., a microLED. Because the active layer is typically very thin, this edge emission occurs over a small extent in the vertical direction (y-direction in FIG. 1).

LEDs are made from semiconductors, which have a high refractive index (typically >2.5). If the LED is interfaced to a lower refractive index medium, all light rays incident on that interface at more than a critical angle $\theta_c$ (relative to normal to the interface) experiences total internal reflection (TIR). Some fraction of the light incident on the interface at less than $\theta_c$ is extracted from the LED (some of the light is also reflected); this fraction is known as the light extraction efficiency (LEE).

A multimode optical waveguide supports propagation of a limited cone of angles. This cone has an angular extent $\theta_{WG}$ (see FIG. 1) that is typically expressed as the waveguide's numerical aperture (NA), where $NA=\sin(\theta_{WG})$. A challenge in waveguide-based LED-based optical communications is to maximize optical coupling efficiency from the LED into the waveguide.

There can be two main challenges in coupling light efficiently from an LED to a waveguide: extracting the light from the LED structure and coupling the extracted light efficiently to a waveguide.

LEE can be increased by decreasing reflections at the LED-external medium (L-E) interface. This can be accomplished by (1) decreasing the index-of-refraction step at the interface; (2) having the light strike the interface at angles closer to normal incidence. Techniques for accomplishing both of these are discussed below.

Figure 2:
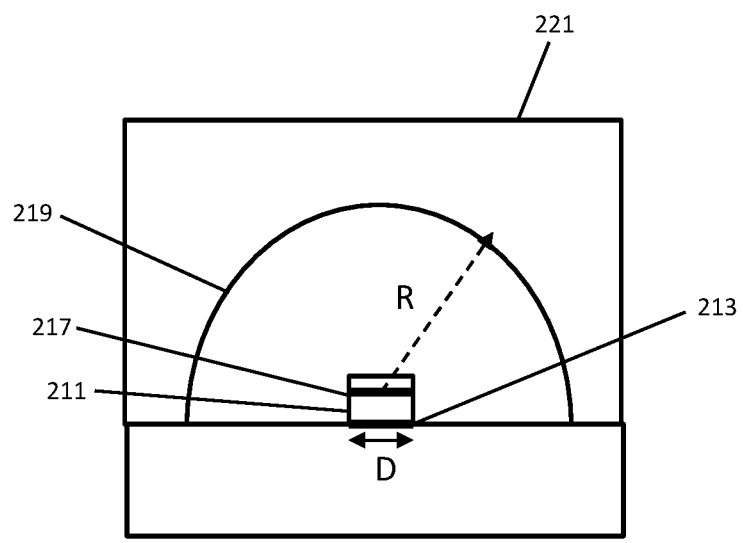
FIG. 2 shows an LED encapsulated by an encapsulant in a waveguide medium.

FIG. 2 shows an LED encapsulated by an encapsulant. In FIG. 2, the LED 211 has a rear contact 213 (or bottom contact, as viewed in FIG. 2) of a reflective material. The rear contact is on a substrate 215. The LED is shown as having a width D. The LED, including its active layer 217, is encapsulated by the encapsulant 219, at least above the rear contact. In FIG. 2, the encapsulant is shown as being on the substrate as well, with the encapsulant generally extending a radius R from a center of the active layer. The encapsulant is within a waveguide medium 221, providing a propagation medium, with the waveguide medium also on the substrate.

The index step at the L-E interface can be decreased by encapsulating the LED in an "encapsulant" medium more closely matching the LED's index, with the ideal case being that the encapsulant index matches that of the LED. In some embodiments, the encapsulant and/or propagation medium may be an inorganic substance such as $SiO_2$, $SiO_xN_y$, $Si_3N_4$, $Al_2O_3$, indium tin oxide (ITO), $TiO_2$, or their stoichiometric variants. In some embodiments the encapsulant and/or propagation medium may be an organic substance such as a polymer.

There is, in turn, an encapsulant-propagation medium (E-P) interface, where light travels through the propagation medium to the receiver end of the optical link. If the LED is encapsulated directly in the propagation medium then there is no explicit encapsulant-propagation medium interface. In some embodiments a combination of thin-films of the materials mentioned above are alternated to act as an anti-reflective coating on the surfaces of the LED or encapsulant.

Similar to the L-E interface, there is also the possibility of reflections at the E-P interface. In fact, if the E-P interface is parallel to the L-E interface through which a ray is transmitted, the encapsulant does not improve LEE because net reflection will be the same with or without the encapsulant. Light should ideally strike the E-P interface at normal incidence, in which case there is no TIR (though there is still Fresnel reflection from the index discontinuity). This normal condition is approached for all rays if the E-P interface is a spherical surface centered on the center of the LED's emitting area, where the sphere's radius R is significantly larger than the LED's emitting diameter D. Accordingly, in some embodiments the E-P interface is a spherical surface centered on a center of the LED's emitting area, and in some such embodiments the spherical surface has a radius R significantly larger than the LED's emitting diameter D In some embodiments R is significantly larger than D if R is 5 or more times greater than D. In some embodiments R is significantly larger than D if R is 10 or more times greater than D. In some embodiments R is significantly larger than D if R is 100 or more times greater than D. Due to the very small emitting diameters of microLEDs, modest R values can provide significant LEE improvements.

The surface of the encapsulant may be curved by a number of methods such as: (1) thermal reflow, e.g., heating a polymer above its glass transition temperature; (2) lithographic methods, e.g., over-exposure of a photosensitive material in positive tone; or (3) etching processes, e.g., oxygen plasma etch of organic material or phosphoric acid-based etching of silicon nitride.

In some embodiments, the LED surface is roughened to increase LEE. If the surface is rough on the scale of the optical wavelength, LEE can be significantly increased at the interface between an LED and a low-index medium compared to a smooth interface.

Figure 3A:
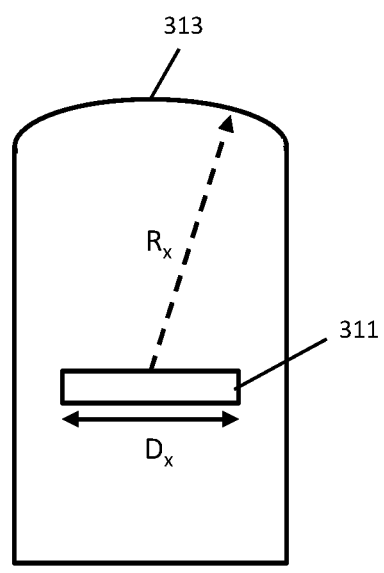
FIG. 3a shows an LED with a curved top surface.

In some embodiments, the shape of LED's surfaces may be altered to improve LEE. In this case, the LED outside of the emitting area can be thought of as an encapsulant. FIG. 3a shows an LED with a curved top surface 313, where the radius of curvature $R_x$ is centered in the center of the emitting area 311 of size $D_x$ in the relevant dimension. This causes light to be incident on the L-E interface at closer to normal incidence, increasing LEE. The impact becomes significant as $R_x$ becomes significantly larger than D.

In some embodiments, the LED's active layer may not extend all the way to the sides of the LED. In these embodiments, curving the LED's surfaces may be more effective in reducing reflections because the emitting diameter can be made smaller relative to the surface's radius of curvature.

Figure 3B:
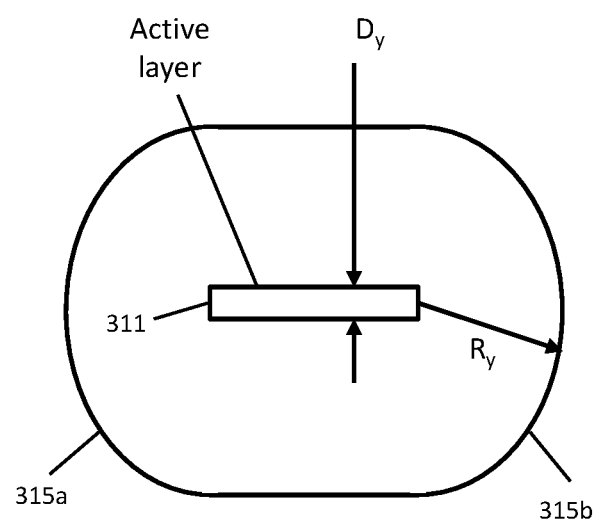
FIG. 3b shows an embodiment in which the active layer of an LED does not extend all the way to the sides of the LED and where the sides are curved.

FIG. 3b shows an embodiment in which the active layer 311 of an LED does not extend all the way to the sides of the LED and where the sides 315a,b are curved with a radius $R_y$. For edge emission, the vertical emitting dimension $D_y$ is very small. This enables a significant LEE improvement for modest $R_y$ values.

In some embodiments, the LED sides may not be at a right angle to the active layer; for instance, the sides may be radiused or at a non-normal angle. In some embodiments the edge is straight and undercut so the LED is shaped like an inverted pyramid. In such embodiments less LED light may be reflected or refracted downward toward the substrate to which the LED is attached, which will reduce light lost into the substrate.

In some methods, angling and/or radiused LED sides can be fabricated by utilizing a halogen-based dry etch and altering plasma pressure and power, for example as discussed in IEEE Photonics Technology Letters, 17-1, 2005 DOI:10.1109/LPT.2004.837480, the disclosure of which is incorporated by reference herein, and by using KOH anisotropic etch.

In some embodiments a dipole radiation pattern of the LED active layer is modified by exploiting optical cavity effects, especially in the case of quantum well (QWs) devices and by employing a highly reflective layer (e.g., p-contact) in close proximity to the QWs, such that light emission is predominantly coupled into lateral modes. In some embodiments this is accomplished by "tuning" the total thickness of the epitaxial layers above the QWs, and the effectiveness is increased by employing a highly reflective p-side contact, such as Ag-based contacts. In this embodiment with the proper cavity tuning, light is guided within the GaN epitaxial layers toward the LED mesa edges at angles close to the side surface normal such that only a small fraction of the light suffers from TIR at the L-E interface.

Figure 4:
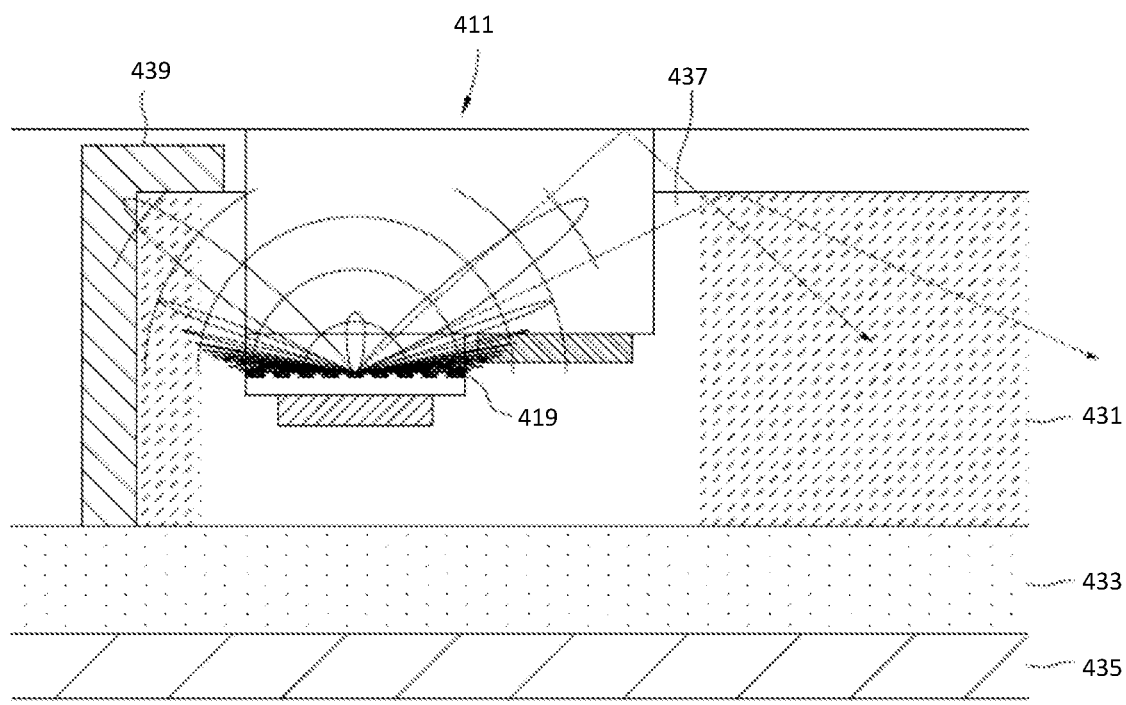
FIG. 4 illustrates an LED in an insertion hole of a waveguide, along with an example dipole radiation pattern for light emitted by the LED.

Further, this light can couple into a waveguide at angles within its numerical aperture (NA), resulting in highly efficient coupling of light from the LED active layers to the waveguide. In some embodiments, in order to direct light in one direction, one end of the waveguide may be capped by a reflective metallization 439 (for example processed onto an Si interconnect chip), for example as illustrated in FIG. 4. In FIG. 4, an insertion hole 437 is provided or formed such that the mesas containing the LEDs chip can be inserted into the insertion holes, effectively inserting an active layer 419 of the microLED inside the waveguide in some embodiments. A dipole radiation pattern 411 is generally directed somewhat laterally with respect to the normal of a substrate 433, 435 on which a waveguide 431 reposes, such that light from the active layer may be preferentially guided or emitted towards and into the waveguide. In order to direct light in one direction of the waveguide, one end of the waveguide may be capped by a reflective metallization 439, for example as illustrated in FIG. 4.

In one set of embodiments, a reflector is located above the active region at a distance from the active region such that edge emission is maximized. In a further set of embodiments, the sides of the LED are angled such that an inverted pyramid is formed, causing the center angle of the emitted distribution to coincide approximately with the optical propagation axis of the waveguide, maximizing coupling into the waveguide. In another set of embodiments, the edge of the LED is radiused with a center of curvature coinciding with the center of the surface of the LED.

In another set of embodiments, a reflector is located below the active region at a distance from the active region such that edge emission is maximized. In a further set of embodiments, the sides of the LED are angled such that a pyramid is formed, causing the center angle of the emitted distribution to coincide approximately with the optical propagation axis of the waveguide, maximizing coupling into the waveguide.

In a different set of embodiments, a reflector is located at a distance from the active region such that surface emission is maximized. In a further set of embodiments, the top surface of the LED is radiused with a radius of curvature centered at the center of the surface of the active area.

Once light is extracted from a LED, the light typically has a very wide angular spectrum that significantly exceeds the range of acceptance angles of the waveguide (often expressed as the "numerical aperture" of the waveguide). Additionally, the light emitted by the LED may be propagating in a direction away from the acceptance cone of the waveguide.

The product of the spatial and angular aperture of an LED is expressed by its etendue. The etendue of an LED generally cannot be reduced; it can only be preserved or increased. Mirrors can be used to confine LED emission to a hemisphere. In some embodiments these mirrors can be fabricated as part of the LED's structure itself, as shown in FIGS. 5a and 5b.

Through the use of curved optical surfaces external to the LED, whether refractive (e.g., a lens) or reflective (e.g., a curved mirror), the spatial and angular distribution widths of an LED can be traded off. If the light from an LED expands spatially by a factor M in one dimension, the angular width of the LED's light in that dimension can be reduced to 1/M of its previous extent. The ability to reduce angular width by increasing spatial width may be especially powerful for very small microLEDs, and this reduction of angular width allows the LED's light to be efficiently coupled to a waveguide with a limited NA. For instance, a 1 um×1 um microLED can be efficiently coupled to a 4 um×4 um waveguide with an NA of 0.25 (which is quite practical for a multimode waveguide) if appropriate curved optical elements are used. This is discussed below.

Figure 5A:
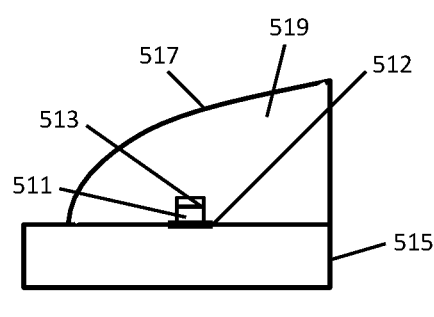
FIGS. 5a and 5b show a side sectional view and a top sectional view, respectively of an embodiment with an end of a waveguide in the form of a curved reflector that reflects light launched from the top of a LED down the axis of a waveguide.
Figure 5B:
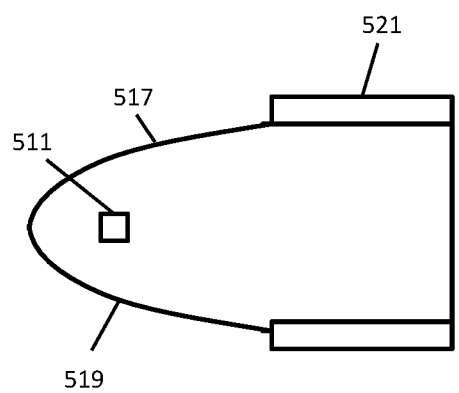

FIGS. 5a and 5b show a side sectional view and a top sectional view, respectively of an embodiment with an end of a waveguide in the form of a curved reflector that reflects light launched from the top of a LED down the axis of a waveguide. In FIGS. 5a and 5b, an LED 511 with a rear reflector/contact 512 is on a substrate 515. The LED, including its active layer 513, is in a waveguide medium 519. The waveguide medium has a parabolic-shaped end, in which the LED is located. A parabolic reflector 517 is over the parabolic-shaped end of the waveguide medium. In some embodiments the waveguide is curved in both the horizontal (x) and vertical (y) dimensions. In some embodiments, the reflector is metalized to increase reflectivity from the curved waveguide surface. In some embodiments, the reflector is approximately parabolic in shape with the center of the LED's top surface at the parabola's focus to minimize the angular spread of the reflected light.

Figure 6A:
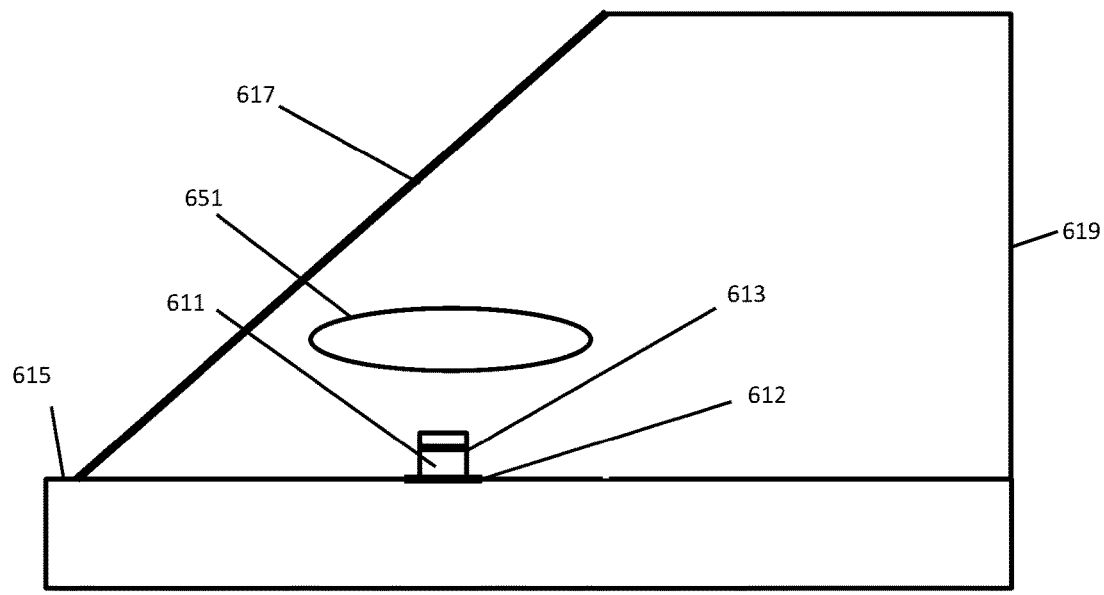
FIG. 6a illustrates an embodiment in which a convex lens in a waveguide medium is in an optical path of light from an LED.

In some embodiments, a convex lens with a higher index than the waveguide medium is introduced into the path of the vertical light along with a 45° turning mirror. FIG. 6a illustrates an embodiment in which a convex lens in a waveguide medium is in an optical path of light from an LED. In FIG. 6a, an LED 611 with a rear reflector/contact 612 is on a substrate 615. The LED, including its active layer 613, is in a waveguide medium 619. The waveguide medium has an angled end, in which the LED is located. In FIG. 6a, the angled end is at an angle of approximately 45 degrees to the substrate, with the angled end sloping over the LED. A reflector 617 is on the angled end of the waveguide medium, with the reflector forming the 45° turning mirror. A lens 651 is in the waveguide medium, between the LED and the reflector. In FIG. 6a the lens is a convex high index lens. The lens is located approximately one focal length from the center of the top surface of the LED, allowing the light to expand for a distance before reducing its angular extent. The 45° turning mirror then deflects the light so the center of its angular cone is parallel to a propagation axis of the waveguide.

Figure 6B:
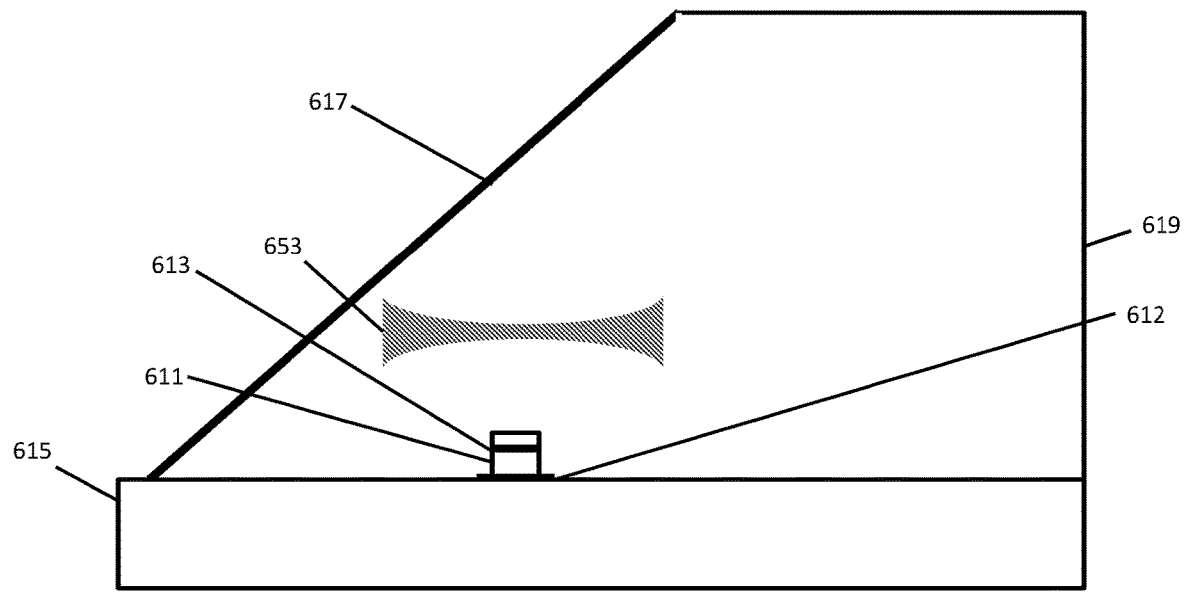
FIG. 6b illustrates an embodiment in which a concave lens in a waveguide medium is in an optical path of light from an LED.

In some embodiments, a concave lens with a lower index than the waveguide medium is introduced into the path of the vertical light along with a 45° turning mirror. FIG. 6b illustrates an embodiment in which a concave lens in a waveguide medium is in an optical path of light from an LED. As in FIG. 6a, in FIG. 6b, an LED 611 with a rear reflector/contact 612 is on a substrate 615. The LED, including its active layer 613, is in a waveguide medium 619. The waveguide medium has an angled end, in which the LED is located. Also as with FIG. 6a, in FIG. 6b the angled end is at an angle of approximately 45 degrees to the substrate, with the angled end sloping over the LED. A reflector 617 is on the angled end of the waveguide medium, with the reflector forming the 45° turning mirror. A lens 653 is in the waveguide medium, between the LED and the reflector. In FIG. 6b the lens is a convex high index lens. The lens is located approximately one focal length from the center of the top surface of the LED, allowing the light to expand for a distance before reducing its angular extent. The 45° turning mirror then deflects the light so the center of its angular cone is parallel to the propagation axis of the waveguide.

Figure 7A:
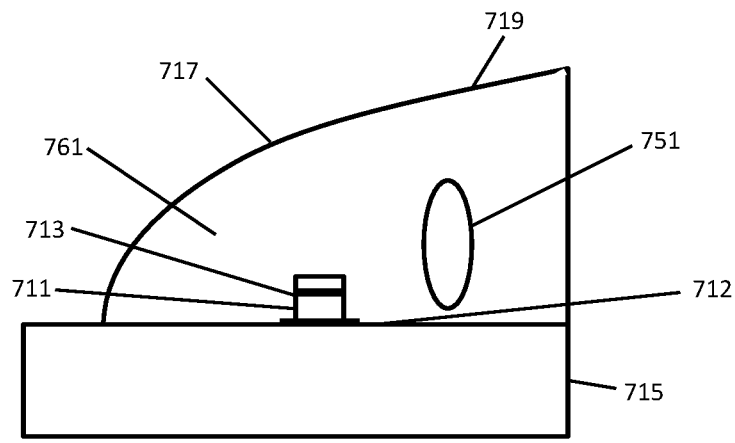
FIG. 7a illustrates a further embodiment in which a convex lens in a waveguide medium is in an optical path of light from an LED.

In some embodiments, a convex lens with a higher index than the waveguide medium is introduced into the path of the horizontal light emitted from the edge of a LED's active layer. FIG. 7a illustrates a further embodiment in which a convex lens in a waveguide medium is in an optical path of light from an LED. In FIG. 7a, an LED 711 with a rear reflector/contact 712 is on a substrate 715. The LED, including its active layer 713, is in a waveguide medium 719. The waveguide medium has a parabolic-shaped end, in which the LED is located. A parabolic reflector 717 is over the parabolic-shaped end of the waveguide medium. A lens 751 is located approximately one focal length from the side of the active layer of the LED, allowing the light to expand for a distance before reducing its angular extent. The lens of FIG. 7a may be, for example a convex lens with a higher index of refraction than the waveguide medium.

Figure 7B:
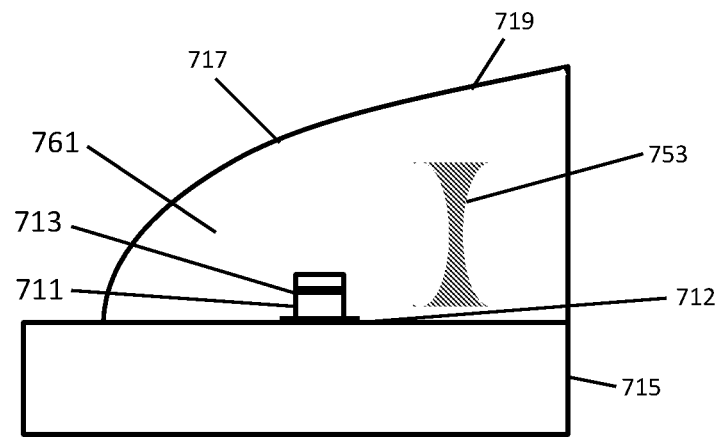
FIG. 7b illustrates a further embodiment in which a concave lens in a waveguide medium is in an optical path of light from an LED.

In some embodiments, a concave lens with a lower index than the waveguide medium is introduced into the path of the horizontal light emitted from the edge of a LED's active layer. FIG. 7b illustrates a further embodiment in which a concave lens in a waveguide medium is in an optical path of light from an LED. In FIG. 7b, as in FIG. 7a, an LED 711 with a rear reflector/contact 712 is on a substrate 715. The LED, including its active layer 713, is in a waveguide medium 719. The waveguide medium has a parabolic-shaped end, in which the LED is located. A parabolic reflector 717 is over the parabolic-shaped end of the waveguide medium. A lens 753 is located approximately one focal length from the side of the active layer of the LED, allowing the light to expand for a distance before reducing its angular extent. The lens of FIG. 7b may be, for example a concave lens with an index of refraction lower than that of the waveguide medium.

Figure 8B:
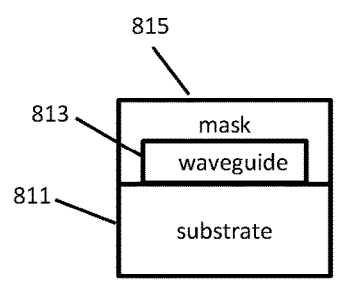
FIGS. 8a-e illustrate process steps of forming a curved waveguide sidewall structure.
Figure 8D:
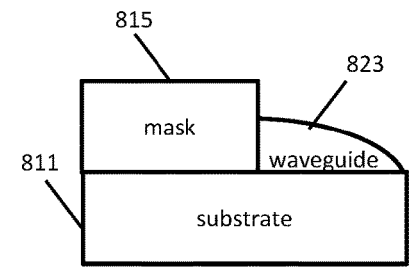
Figures 8A, 8C, 8E:
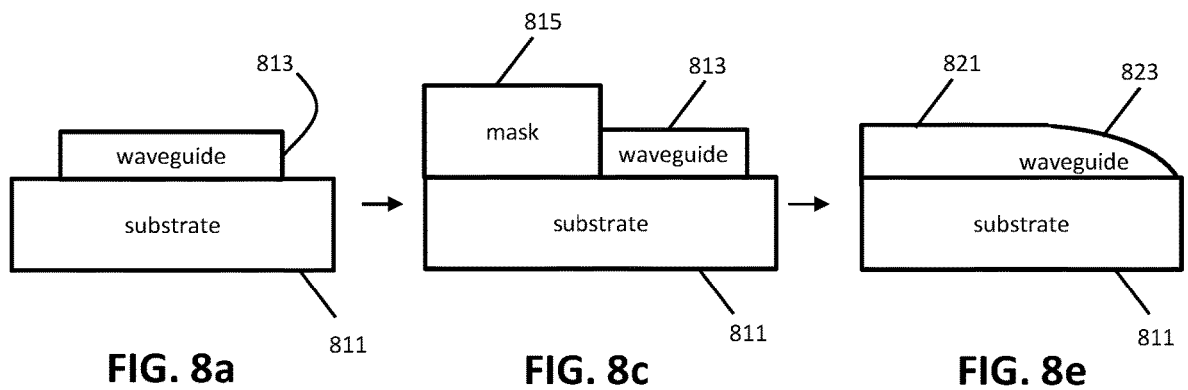

The curved waveguide sidewall structures in FIGS. 5a,b and 7a,b can be made via various methods. In one set of methods shown in FIGS. 8a-e, which illustrates process steps of forming a curved waveguide sidewall structure. In FIG. 8a, a core waveguide layer 813 is deposited on a substrate 811, and the waveguide layer is patterned into waveguides with sharp end faces through some lithographic technique. A mask 815 is then deposited that protects the waveguide except for a small length at the end that is exposed, as may be seen in FIG. 8b, which shows a view down an axis of the waveguide and FIG. 8b, which shows a side view. The exposed waveguide is subjected to an etching process that rounds sharp edges of the waveguide, to provide a rounded edge 823, as may be seen in FIG. 8c. By controlling the various etching parameters, the profile of the waveguide surface can be made to approximate the desired shape, e.g., a parabola with the desired measurements. Finally, the mask is removed, leaving a planar waveguide layer 821 with a curve end 823 on top of a substrate, as may be seen in FIG. 8d.

Figure 9:
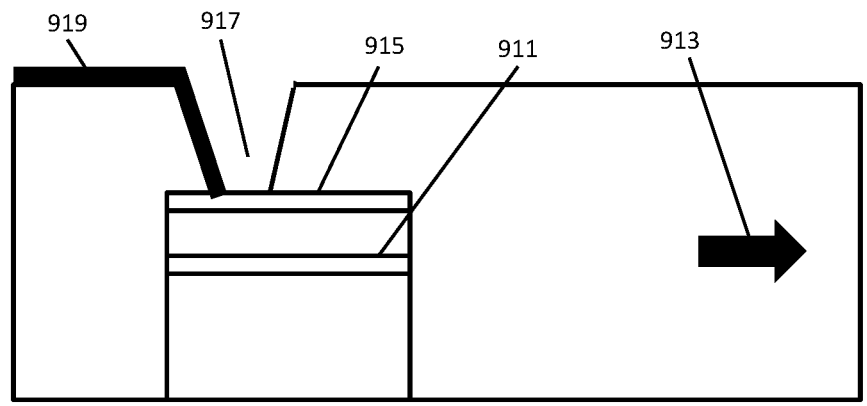
FIG. 9 shows an example electrical connection to an LED in a waveguide medium.

In some embodiments of an LED encapsulated in an optical waveguide, an electrical connection is made from the top of the waveguide to a contact on top of an LED by a via through the waveguide. FIG. 9 shows an example electrical connection to an LED in a waveguide medium. In FIG. 9, an LED includes an active layer 911. The LED, and particularly the active layer, is in a waveguide medium 913. A top of the LED includes an electrically conductive contact 915. A portion of the top contact is exposed by a via 917 in the waveguide medium. A metal trace 919 or layer extends along a portion of a top of the waveguide medium and down a side of the via to contact the top contact. In a further set of embodiments, the top contact of the LED is transparent and may comprise a conductive oxide such as indium tin oxide (ITO). The transparent contact helps to spread the current from the small via contact point, and may protect the semiconductor material during fabrication. In some embodiments the via is as small as possible and closest to the back of the LED (relative to the waveguide's propagation direction) to minimize optical losses. In some embodiments, the semiconductor material is GaN and the top part of the LED contacted by the ITO is p-doped GaN.

Although the invention has been discussed with respect to various embodiments, it should be recognized that the invention comprises the novel and non-obvious claims supported by this disclosure.

What is claimed is:

1. An optical coupling arrangement for an optical communication system, comprising:
    a microLED on a substrate, the microLED having a top surface and a bottom surface with an active layer therebetween;
    a waveguide on the substrate, the microLED being at least partially within the waveguide;
    a reflector on at least a portion of the waveguide, the reflector positioned to reflect light from the microLED down an axis of the waveguide; and
    a lens within the waveguide and in an optical path between the microLED and the reflector, the lens separated by one focal length from the active layer of the microLED.

2. The optical coupling arrangement of claim 1, wherein the active layer of the microLED is within the waveguide.

3. The optical coupling arrangement of claim 1, wherein the bottom surface of the reflector has a bottom reflector.

4. The optical coupling arrangement of claim 1, wherein the lens is a convex lens.

5. The optical coupling arrangement of claim 4, wherein the lens is of a material with a higher index of refraction than material of the waveguide.

6. The optical coupling arrangement of claim 1, wherein the lens is a concave lens.

7. The optical coupling arrangement of claim 6, wherein the lens is of a material with a lower index of refraction than material of the waveguide.

8. The optical coupling arrangement of claim 1, wherein the reflector forms a 45-degree turning mirror.

9. The optical coupling arrangement of claim 1, wherein the microLED includes a curved surface.

10. The optical coupling arrangement of claim 1, wherein the active layer of the microLED is separated from side edges of the microLED.

11. The optical coupling arrangement of claim 10, wherein the microLED includes a curved surface.

12. The optical coupling arrangement of claim 1, further comprising an electrical connection from a top of the waveguide, through a via in the waveguide, to a conductive contact on the top surface of the microLED.

13. The optical coupling arrangement of claim 1, wherein the top surface of the microLED is curved with a radius of curvature centered in a center of the active region of the microLED.

14. The optical coupling arrangement of claim 1, wherein side edges of the microLED are angled to make the microLED pyramid-shaped.

* * * * *